United States Patent [19]
Adams

[11] Patent Number: 5,825,091
[45] Date of Patent: Oct. 20, 1998

[54] SENSOR ASSEMBLY MOUNTED TO A LEADFRAME WITH ADHESIVE DEPOSITS AT SEPARATE LOCATIONS

[75] Inventor: Victor J. Adams, Tempe, Ariz.

[73] Assignee: Motorola, Inc., Schaumburg, Ill.

[21] Appl. No.: 823,702

[22] Filed: Mar. 25, 1997

[51] Int. Cl.$^6$ .................................................. H01L 23/48
[52] U.S. Cl. ........................ 257/777; 257/666; 257/669; 257/778
[58] Field of Search ..................................... 257/676, 666, 257/415, 417–420, 669, 682, 777, 778

[56] References Cited

U.S. PATENT DOCUMENTS

| | | | |
|---|---|---|---|
| 4,816,896 | 3/1989 | Owens | 257/777 |
| 4,942,383 | 7/1990 | Lam et al. | 338/42 |
| 5,454,270 | 10/1995 | Brown et al. | 73/721 |
| 5,465,626 | 11/1995 | Brown et al. | 73/721 |
| 5,523,628 | 6/1996 | Williams et al. | 257/777 |
| 5,721,451 | 2/1998 | Settles et al. | 257/679 |

*Primary Examiner*—David B. Hardy
*Attorney, Agent, or Firm*—Robert D. Atkins

[57] ABSTRACT

An integrated circuit sensor assembly (10) is mounted to a solid surface (11) of a metal leadframe (12) by placing RTV adhesive (30–36) at the four corners of the substrate (14). The RTV material cover less than the entire surface area between the leadframe surface and the substrate. The RTV provides coplanar support for the sensor assembly while maintaining a gap between a significant portion of the surface area between the substrate and the leadframe surface. The metal leadframe undergoes compression and expansion stresses from temperature cycling during the manufacturing process. The gap decouples the sensor assembly from leadframe and provides stress isolation. Moreover, the flexibility and resiliency of the four corner RTV dots absorb stress induced by the leadframe.

20 Claims, 1 Drawing Sheet

SENSOR ASSEMBLY MOUNTED TO A LEADFRAME WITH ADHESIVE DEPOSITS AT SEPARATE LOCATIONS

CROSS REFERENCE TO RELATED PATENT APPLICATIONS

This application is related to copending U.S. patent application Ser. No. 08/758,660, Attorney's Docket SC10019T, entitled "INTEGRATED CIRCUIT ASSEMBLY ADHESIVE AND METHOD THEREOF", filed Dec., 2, 1996, by John R. Settles et al and assigned to the same assignee, Motorola, Inc.

BACKGROUND OF THE INVENTION

The present invention relates in general to integrated circuits and, more particularly, to an adhesive applied between a semiconductor die and a supporting structure to support the semiconductor die while maintaining a gap to provide stress isolation from the support structure.

An integrated circuit (IC) assembly typically comprises a support structure such as a leadframe that forms a physical and structural foundation for a semiconductor die. The semiconductor die is electrically connected to the leadframe through bond wires to allow communication to external devices as is well known.

One IC application is a sensor that provides an electrical signal representative of a sensed acceleration and deceleration. For example, in an automotive application, the sensor detects a deceleration from a collision and provides an electrical signal that triggers deployment of an air bag.

The sensor is typically constructed with a micromachined sensing element attached to a substrate forming a sensing assembly. The sensing assembly is attached to a surface or pad of a metal leadframe with a room temperature vulcanizing (RTV) adhesive. The RTV material is distributed evenly over the entire surface area between the sensor assembly and the leadframe mounting surface.

Ideally, the electrical signal from the sensor is linearly related to the magnitude of acceleration or deceleration. However, the sensing element is extremely sensitive to stress. A significant amount of stress can be introduced by the leadframe. The metal leadframe expands and contracts with temperature thereby transferring stress through the RTV material to the sensing element. The stress from temperature cycling the leadframe during manufacturing introduces a bow or stretch in the sensing elements which translates into a non-linear component in the electrical signal and makes the sensor unusable. Sensors that use RTV material over the entire surface area between the sensor assembly and the leadframe mounting surface experience low yields which increases costs and reduces profitability.

Hence, a need exists for an IC assembly that is stress isolated from the support structure.

Figure 1:
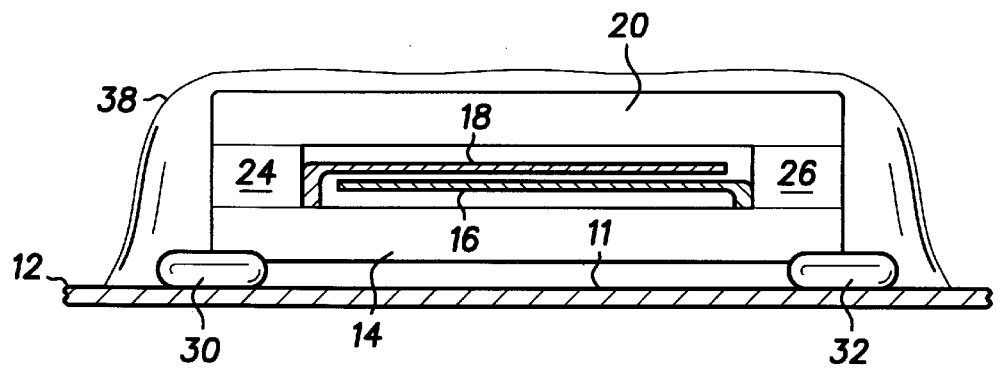
FIG. 1 is a side-view illustrating a sensor assembly mounted to a leadframe with an adhesive deposited at selected locations.

DETAILED DESCRIPTION OF THE PREFERRED EMBODIMENT erring to FIG. 1, a side-view of sensor assembly 10 is shown mounted or attached to a solid surface or pad 11 of leadframe 12. Leadframe 12 is made of copper, alloy-42 metal, or polymer material and operates as a support structure for sensor assembly 10. Alloy-42 is desirable because it possesses characteristics of thermal expansion that are closely matched to the silicon composition of sensor assembly 10.

Sensor assembly 10 is a semiconductor die that includes a silicon substrate 14 about 350 microns in thickness. Sensing structure 16 and sensing structure 18 are layers of poly-glass disposed above substrate 14. Sensing structures 16 and 18 are patterned by successive processes of deposition and photo-etching. A dissolution process removes away unwanted poly-glass material leaving the structure shown in FIG. 1. Sensing structure 16 and sensing structure 18 are each about 2 microns thick. There is about 2 microns of spacing between substrate 14 and sensing structure 16, between sensing structure 16 and sensing structure 18, and between sensing structure 18 and silicon cap 20. Alternatively, the sensing element can be micro-machined to the desired dimensions. Cap 20 is supported by glass supports 24 and 26 which are mounted to substrate 14. Sensing structures 16 and 18 form a cantilevered structure with an associated capacitance $C_1$ between substrate 14 and sensing structure 16 and an associated capacitance $C_2$ between sensing structure 18 and silicon cap 20. The air space between cap 20 and substrate 14 is atmospherically controlled with nitrogen or other ambient gas for damping sensing structures 16 and 18 during minor movements.

In a no-external force environment, the capacitances $C_1$ and $C_2$ are equal. In response to an externally applied acceleration or deceleration, sensing structure 16 and sensing structure 18 are displaced which alters the capacitances, i.e. $C_1$ becomes larger than $C_2$ or visa versa. An electrical circuit (not shown) detects the change in capacitances and provides an electrical signal representative of the applied acceleration. Sensor assembly 10 should be in a stress-free state absent any applied acceleration.

In an alternative embodiment, the sensor assembly includes a trampoline structure with a center plate supported at the corners by four arms mounted to the substrate. The capacitance of the sensor assembly changes as the center plate is displaced in the presence of an externally applied acceleration or deceleration.

In the prior art, the sensor assembly is mounted to a base or pad of the leadframe with a layer of RTV material about 125 microns thick. The RTV material covered the entire surface area between the leadframe base and the sensor assembly. The leadframe is made of metal and consequently exhibits properties of thermal expansion and contraction during the manufacturing process where temperatures range between −65° C. to +125° C. Any expansion and contraction of the leadframe caused by temperature cycling during the manufacturing process induces stress through the RTV layer to the sensor assembly. The sensor assembly becomes bowed or stretched in response to the induced stress thereby changing the spacing between the sensing structures and adversely effecting the capacitance measurement. The problem is especially acute at low temperature where the RTV material tends to crystallize and transfer more of the stress from the leadframe to the sensor assembly. The stressed sensor assembly has an unacceptable hysteresis response and a nonlinearity error in the electrical signal which reduces manufacturing yields.

Figure 2:
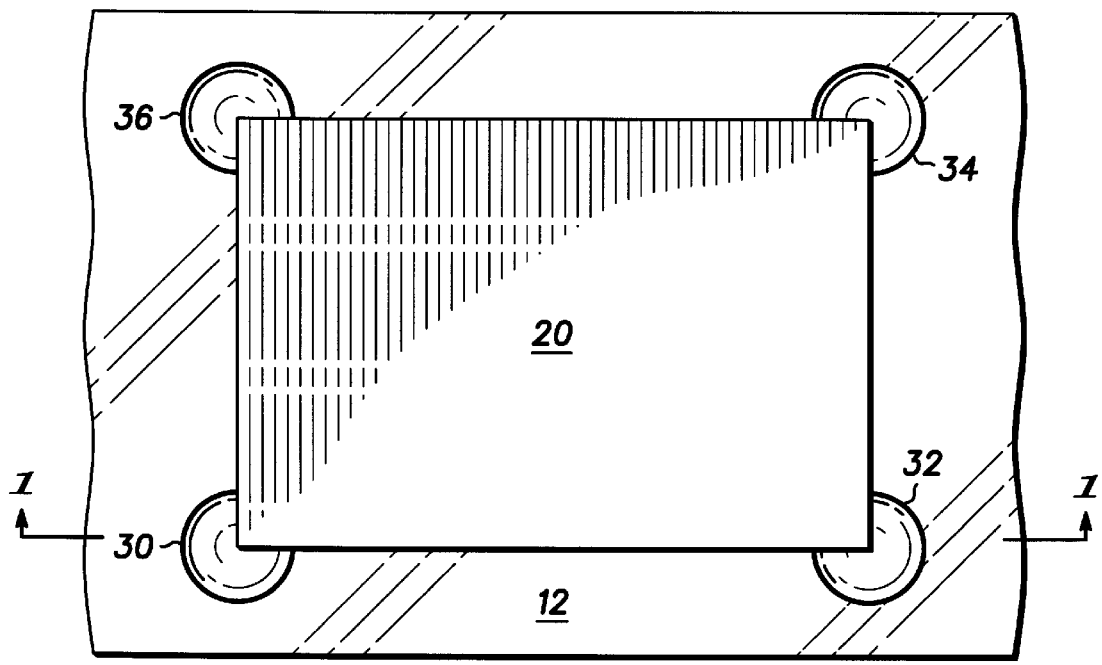
FIG. 2 is a top-view of the sensor assembly.

In the present invention, as part of the manufacturing process, sensor assembly 10 is mounted to a solid surface or pad 11 of leadframe 12 with a pliant RTV or CRTV (custom room temperature vulcanizing) polymer adhesive covering less than the entire surface area between surface 11 and substrate 14. For example, as shown in FIG. 2, RTV dots or bumps 30, 32, 34 and 36 about 350 microns in diameter are deposited at the four corners of substrate 14 with a syringe or other dispensing tool that excretes adhesive material through an orifice under pressure. An additive such as inhibitor may be included in the RTV material to prevent curing below 100° C. Once cured, RTV dots 30–36 act as an adhesive to securely attach sensor assembly 10 to surface 11 of leadframe 12. The RTV dots support sensor assembly 10 so as to create a gap between the solid surface of leadframe 12 and substrate 14 which provides stress isolation from the thermal expansion and contraction of leadframe 12. The flexibility and resiliency of RTV dots 30–36 absorb stress induced by leadframe 12. By reducing the contact surface area between leadframe 12 and substrate 14, i.e. supporting the sensor assembly with one or more RTV dots while maintaining a gap elsewhere, the stress transferred from the leadframe to the sensor assembly is significantly reduced.

RTV dots 30–36 also support the four corners of sensor assembly 10 so as to maintain coplanarity for the assembly, i.e. sensor assembly 10 parallel to leadframe 12. Coplanarity is important because final sensor package is typically required to be within 2 degrees perpendicular to the end application surface.

In another aspect of the present invention, an IC is manufactured by disposing an RTV material at the four corners of a semiconductor die which is less than its entire surface. The semiconductor die is mated to a leadframe while maintaining a gap between at least a portion of the surface area of the semiconductor die and the leadframe for stress isolation between the semiconductor die and the leadframe.

In an alternate embodiment, the RTV dots could be placed at other locations around the perimeter of the substrate, e.g. at center of each side. Also, more or fewer RTV dots arranged in other patterns and configurations could support substrate 14. A bead of RTV material may circumscribe the assembly, possibly with gaps for ventilation. In general, the RTV dots are strategically located to provide support for the sensor assembly while maintaining a gap between a significant portion of the surface area between the substrate and the leadframe surface. The gap decouples the sensor assembly from leadframe and provides a degree of stress isolation.

A dome 38 of silicon gel is placed over the entire sensor assembly 10 to isolate the sensor assembly from overmolded epoxy when placed in an IC package. Silicon dome 38 completely covers sensor assembly 10. A large amount of silicon gel must be deposited over the sensor assembly to ensure adequate coverage. If any portion of sensor assembly comes into contract with epoxy of the IC package, then stresses can be transferred to the sensor assembly resulting in failure. RTV dots 30–36 at the four corners of substrate 14 provide anchor points for the silicon gel so it does not expose corners of the sensor assembly or wick out from the form factor of the sensor assembly and interfere with other adjacent structure or components.

The present invention also contemplates other types of semiconductor die or miniaturized structures requiring stress isolation. Any type of semiconductor die can be mounted to a support structure such as a leadframe with an RTV material placed at strategic locations between the substrate and the leadframe, i.e. four corners, to provide support while maintaining a stress isolating gap.

By now it should be appreciated that the present invention provides stress isolation by placing RTV dots at strategic locations between the substrate of a sensor assembly and a leadframe to provide support for the sensor assembly while maintaining a gap between a significant portion of the surface area between the substrate and the leadframe surface. The gap decouples the sensor assembly from leadframe and provides stress isolation. Manufacturability of the sensor assembly is improved because it is easier to dispense a number of RTV dots and place the assembly on the dots than it is to spread a much larger amount of RTV material to cover the entire surface area between the assembly and leadframe and still maintain coplanarity with the leadframe. Moreover, the manufacturing yield improves with the present invention because the sensor assembly is subject to less leadframe induced stress.

What is claimed is:

1. A semiconductor device, comprising:

a support structure having a solid surface;

an assembly for mounting to the solid surface of the support structure; and a plurality of adhesive dots comprising a room temperature vulcanizing (RTV) material deposited at separate locations less than an entire surface area of the assembly where the plurality of adhesive dots bond the assembly to the support structure while maintaining a gap between at least a portion of the assembly and the solid surface of the support structure for stress isolation.

2. The semiconductor device of claim 1 wherein the support structure comprises a leadframe.

3. The semiconductor device of claim 1 wherein the assembly comprises a sensor.

4. The semiconductor device of claim 1 wherein the plurality of adhesive dots are deposited at a plurality of locations less than the entire surface area of the assembly to maintain the assembly coplanar with respect to the support structure.

5. The semiconductor device of claim 1 wherein the RTV material is applied at selected locations around a perimeter of the assembly.

6. The semiconductor device of claim 5 wherein the RTV material is applied at corner locations of the assembly.

7. The semiconductor device of claim 6 wherein a silicon gel is disposed over the assembly and covers the RTV material.

8. An integrated circuit, comprising:

a leadframe having a solid surface; and a sensor assembly mounted to the solid surface of the leadframe with an adhesive comprising a room temperature vulcanizing (RTV) material deposited at locations less than an entire surface area of the sensor assembly where the adhesive bonds the sensor assembly to the leadframe while maintaining a gap between at least a portion of the sensor assembly and the solid surface of the leadframe for stress isolation.

9. The integrated circuit of claim 8 wherein the RTV material is applied at selected locations around a perimeter of the sensor assembly.

10. The integrated circuit of claim 8 wherein the RTV material is applied at corners of the sensor assembly.

11. The integrated circuit of claim 10 wherein a silicon gel is disposed over the sensor assembly and covers the RTV material.

12. A semiconductor device, comprising:

a support structure having a solid surface;

a semiconductor assembly for mounting to the support structure; and a plurality of adhesive deposits comprising a room temperature vulcanizing (RTV) material disposed at separate locations between the support structure and the semiconductor assembly where the plurality of adhesive deposits bond the semiconductor assembly to the support structure while maintaining a gap between the semiconductor assembly and the support structure for stress isolation.

13. The semiconductor device of claim 12 wherein the support structure comprises a leadframe.

14. The semiconductor device of claim 12 wherein the semiconductor assembly comprises a sensor.

15. The semiconductor device of claim 12 wherein the RTV material is applied at selected locations around a perimeter of the semiconductor assembly.

16. The semiconductor device of claim 15 wherein the RTV material is applied at corner locations of the semiconductor assembly.

17. A semiconductor device, comprising:

a support structure having a solid surface;

a semiconductor assembly for mounting to the support structure; and an adhesive deposit comprising a room temperature vulcanizing (RTV) material disposed at less than an entire surface area of the semiconductor assembly where the adhesive deposit bonds the semiconductor assembly to the support structure while maintaining a gap between the semiconductor assembly and the support structure for stress isolation.

18. The semiconductor device of claim 17 wherein the support structure comprises a leadframe.

19. The semiconductor device of claim 17 wherein the semiconductor assembly comprises a sensor.

20. The sensor assembly of claim 17 wherein the RTV material is applied at selected locations around a perimeter of the semiconductor assembly.

* * * * *